United States Patent [19]
Iwamuro

[11] Patent Number: 5,659,185
[45] Date of Patent: Aug. 19, 1997

[54] INSULATED GATE THYRISTOR

[75] Inventor: Noriyuki Iwamuro, Kawasaki, Japan

[73] Assignee: Fuji Electric Co., Ltd., Tokyo, Japan

[21] Appl. No.: 477,439

[22] Filed: Jun. 7, 1995

[30] Foreign Application Priority Data

Jun. 8, 1994 [JP] Japan .................... 6-126024

[51] Int. Cl.$^6$ .................... H01L 29/74; H01L 31/111
[52] U.S. Cl. .................... 257/138; 257/107; 257/133; 257/147; 257/151; 257/152; 257/153
[58] Field of Search .................... 257/107, 133, 257/138, 147, 151, 152, 153

[56] References Cited

U.S. PATENT DOCUMENTS

| | | | |
|---|---|---|---|
| 4,760,431 | 7/1988 | Nakagawa et al. | 257/138 |
| 4,851,889 | 7/1989 | Matsuzaki | 257/144 |

OTHER PUBLICATIONS

Chang et al., "IGBT with a trench gate structure", IEDN, IEEE, pp. 674–677, 1987.
Baliga, "Trench–Gate Base—Resistancee—Controlled Thyristors", IEEE Electron Device Letters, vol. 13, No. 12, Dec. 1992.
"IGBT Mode Turn–Off Thyristor (IGTT) Fabricated on SOL Substrate" Ogura et al. 1992 IEEE, pp. 241–244.
"Double Gate MOS Device Having IGBT and MCT Performances" by Momota et al.; Proceedings of 1992 International Symposium on Power Semiconductor Devices & IC's, Tokyo, pp. 28–33.
"Dual Gate MOS Thyristor (DGMOT)" by Seki et al.; 1993 IEEE pp. 159–164.
"Switching Behavior and Current Handling Performance of MCT–IGBT Cell Ensembles" by Lendenmann et al.; 1991 IEEE pp. 149–152.

*Primary Examiner*—Mahshid D. Saadat
*Assistant Examiner*—Valencia Martin Wallace
*Attorney, Agent, or Firm*—Brumbaugh, Graves, Donohue & Raymond

[57] ABSTRACT

Improved breakdown withstand capability is realized in a double gate insulated gate thyristor with low on-voltage in the thyristor operation mode and high-speed turn-off in the IGBT operation mode. Turn-off current through the lateral MOSFET using a second gate electrode is reduced, and breakdown withstand capability of the insulated gate thyristor is improved by inclusion of a gap in the (n) type source region, by contacting a part of the cathode directly to the (p) type base layer, and by connecting the bipolar transistor and the thyristor in parallel, for a part of the turn-off current to flow through the bipolar transistor to the cathode. A trench-type first gate electrode is preferred.

6 Claims, 6 Drawing Sheets

5,659,185

INSULATED GATE THYRISTOR

BACKGROUND OF THE INVENTION

The present invention relates to insulated gate thyristors used as power switching devices.

Thyristors have been used due to their low on-voltage characteristics as indispensable devices for large capacity power conversion. Gate turn-off ("GTO") thyristors are used very often in the high-voltage, large-current range. However, drawbacks of the GTO thyristors have also become apparent. The drawbacks include: (1) GTO thyristors have a small turn-off gain and require a large gate current for turn-off; (2) GTO thyristors require large snubber circuits for safely turning off the thyristors; (3) the switching speed of the GTO is low, which limits its use to the low frequency range.

In 1984, V. A. K. Temple (cf. IEEE IEDM Tech. Dig., 1984, p282) disclosed a MOS control thyristor ("MCT") which may be classified as a voltage-driven type thyristor. Since then, analysis and improvement of the MCT have been done world wide. This is because the MCT is a voltage driven type thyristor which can be driven with a much simpler gate circuit than the GTO thyristors, and since the MCT turns on at low on-voltage. Recently, new device structures have been proposed which have two insulated gate structures and operate in a thyristor mode when the devices are turned on and at an IGBT (Insulated Gate Bipolar Transistor) mode when the devices are turned off (cf. S. Momota et al., Proc. of IEEE ISPSD, '92(1992), p28, and Y. Seki et al., Proc. of IEEE ISPSD, '93(1993), p159). The new devices realize the low on-voltage characteristics and the high speed switching characteristics in one single device by switching between the operation modes.

FIG. 10 is a sectional view of a double insulated gate MOS device disclosed in 1992 (hereinafter referred to as "DGMOS"). In FIG. 10, a unit (hereinafter referred to as "cell") which includes two control electrodes is shown. An active region which performs switching operation for the conduction and interruption of the main current of the DGMOS is comprised of very many cells. Though the DGMOS includes a voltage withstand structure for sharing the withstand voltage in the peripheral region which surrounds the active region, the description of the voltage withstand structure, which is not related to the essential part of the present invention, will be omitted.

In FIG. 10, an (n) type base layer 43 is formed on an (n) type buffer layer 42 laminated on a surface of a (p) type collector layer 41. A (p) type base region 44 is selectively formed in a surface layer of the (n) type base layer 43. And, (n) type emitter regions 45 are selectively formed in a surface layer of the (p) type base region 44. Emitter regions 46 of (p) type are selectively formed in a surface layer of each (n) type emitter region 45. An emitter electrode 55, connected to an emitter terminal E, contacts in common to the (p) type emitter regions 46 and the (n) type emitter region 45. The first gate electrode 51 is disposed on the first gate oxide film 48 above a surface area of the (n) type emitter region 45 sandwiched between the (p) type base region 44 and the (p) type emitter region 46 and to an exposed surface of the (n) type base layer 43. The first gate electrode 51 is covered with an insulation film 57 and connected to the first gate terminal G1. The second gate electrode 52 is disposed on the second gate oxide film 54 above a surface area of the (n) type emitter region 45 sandwiched between the (p) type emitter region 46 and the (p) type base region 44 and to an exposed surface of the (p) type base region 44. The second gate electrode 52 is covered with the insulation film 57 and connected to the second gate terminal G2. A collector electrode 53, connected to a collector terminal C, contacts to a back surface of the (p) type collector layer 41.

To control the DGMOS, a voltage, the wave form of which is shown in FIG. 11, is applied to the first and second gate electrodes. When the voltage exceeds a threshold value, an inversion layer is formed in the surface area of the (p) type base region 44 below the first gate electrode 51. As electrons pass through the inversion layer, an electron current flows into the (n) type base layer 43 and the (n) type buffer layer 42. Since a positive voltage is applied to the collector electrode 53, the current which has flowed into the (n) type base layer 43 and the (n) type buffer layer 42 yields a base current of a built in pnp transistor consisting of the (p) type collector layer 41, the (n) type buffer layer 42 and the (n) type base layer 43, and the (p) type base region 44. The base current modulates the conductivity of the (n) type base layer 43 and switches on the pnp transistor. A hole current caused by the conductivity modulation yields a base current of a built in npn transistor consisting of the (n) type buffer layer 42 and the (n) type base layer 43, the (p) type base region 44, and the (n) type emitter layer 45, and drives the npn transistor. Since a pnpn transistor consisting of the (p) type collector layer 41, the (n) type buffer layer 42 and the (n) type base layer 43, the (p) type base region 44, and the (n) type emitter layer 45 finally operates, the DGMOS is turned on by the application of the positive voltage to the terminal G1.

The DGMOS of FIG. 10 is turned off by switching off the gate voltages applied to the gate electrodes 51 and 52 with a time lag as shown in FIG. 11. The voltage of the second gate electrode 52 grounded at time t1 becomes negative with respect to the voltage of the emitter electrode 53. As a result, an inversion layer is formed in the surface layer of the (n) type emitter region 45 below the second gate electrode 52, and a p-channel MOSFET is switched on. Since the switching-on of the p-channel MOSFET causes a short circuit of the (p) type base region 44 and the (n) type emitter region 45, the basic structure becomes equivalent to an IGBT. Thus, the DGMOS usually operates in the thyristor mode through the first gate electrode 51, and shifts to the on-state of the IGBT operation mode at the time t1 at the start of turn-off in response to negatively biasing the second gate electrode 52 with respect to the first gate electrode 51. At the time t2, 3 to 4 μsec after the IGBT operation mode started, the DGMOS is turned off by switching off the voltage applied to the first gate electrode 51 to stop the electron supply.

The double insulated gate MOS thyristor disclosed in 1993 has lowered its on-resistance by converting the p-channel device of FIG. 10 to an n-channel one. These devices have features of mode switching which realizes in one single device the low on-resistance of the thyristor and the high speed switching of the IGBT.

However, since a large tail current is caused in the MCTs, they, like the GTO thyristors, are used only in the low frequency range. Furthermore, the maximum controllable current of the double insulated gate thyristors is so small that practical use of the double insulated gate thyristors is limited.

SUMMARY OF THE INVENTION

It is an object of the present invention to provide an insulated gate thyristor which realizes in one device a large controllable current, low on-resistance, and high speed switching. Another object of the present invention is to provide a method of controlling the insulated gate thyristor.

Objects of the present invention are realized by an insulated gate thyristor which comprises a base layer of a first conductivity type and of high resistivity; a base region of a second conductivity type formed in a surface layer on a first side of the base layer; first, second, and third source regions of the first conductivity type formed in a surface layer of the base region; an emitter region of the first conductivity type formed in the surface layer of the base region; a contact region of the second conductivity type formed in the surface layer of the base region in contact with the second source region and the third source region; a first gate electrode formed on an insulation film above a surface area of the base region between the first source region and an exposed area of the base layer; a second gate electrode formed on an insulation film above a surface area of the base region between the first source region and the second source region and above a surface area of the base region between the third source region and the emitter region; an auxiliary electrode contacting in common with the second source region, the third source region, and the contact region; an emitter layer of the second conductivity type formed on the second side of the base layer; an anode disposed on a surface of the emitter layer; and a cathode contacting in common with the first source region, the emitter region and the base region.

Objects of the present invention are realized also in an insulated gate thyristor which comprises a first base layer of a first conductivity type and of high resistivity; a second base layer of a second conductivity type formed in a surface layer on a first side of the first base layer; first, second, and third source regions of the first conductivity type formed in a surface layer of the second base layer; a trench dug from a surface of the second base layer including the first source region down to the first base layer through the second base layer; an emitter region of the first conductivity type formed in the surface layer of the second base layer; a contact region of the second conductivity type formed in the surface layer of the second base layer in contact with the second source region and the third source region; a first gate electrode formed on an insulation film deposited on inside faces of the trench; a second gate electrode formed on an insulation film above a surface area of the second base layer between the first source region and the second source region and above a surface area of the second base layer between the third source region and the emitter region; an auxiliary electrode contacting in common with the second source region, the third source region, and the contact region; an emitter layer of the second conductivity type formed on the second side of the first base layer; an anode disposed on a surface of the emitter layer; and a cathode contacting in common with the first source region, the emitter region and the second base layer.

In the following, the anode may be referred to as "the first main electrode" and the cathode as "the second main electrode".

Preferably, the insulated gate thyristor is provided with a buffer layer of the first conductivity type formed between the first base layer and the emitter layer, the buffer layer being more heavily doped than the first base layer. It is preferable to diffuse the emitter region more deeply than the first, second and third source regions. It is preferable also to divide the first source region into a plurality of source stripes and align the source stripes longitudinally leaving a part of the base region or the base layer (also referred to as "interrupt region") between the spaced source stripes.

An insulated gate thyristor of the present invention is controlled by applying a first voltage to the first gate electrode to turn on the insulated gate thyristor, applying a second voltage to the second gate electrode after the insulated gate thyristor is turned on, and then removing the first voltage.

DESCRIPTION OF PREFERRED EMBODIMENTS

The present invention is described with reference to the accompanied drawing figures which illustrate preferred embodiments of the present invention. Though the present invention is described by way of examples in which the first conductivity type is (n) type and the second conductivity type is (p) type, the conductivity types may be reversed.

Figure 1:
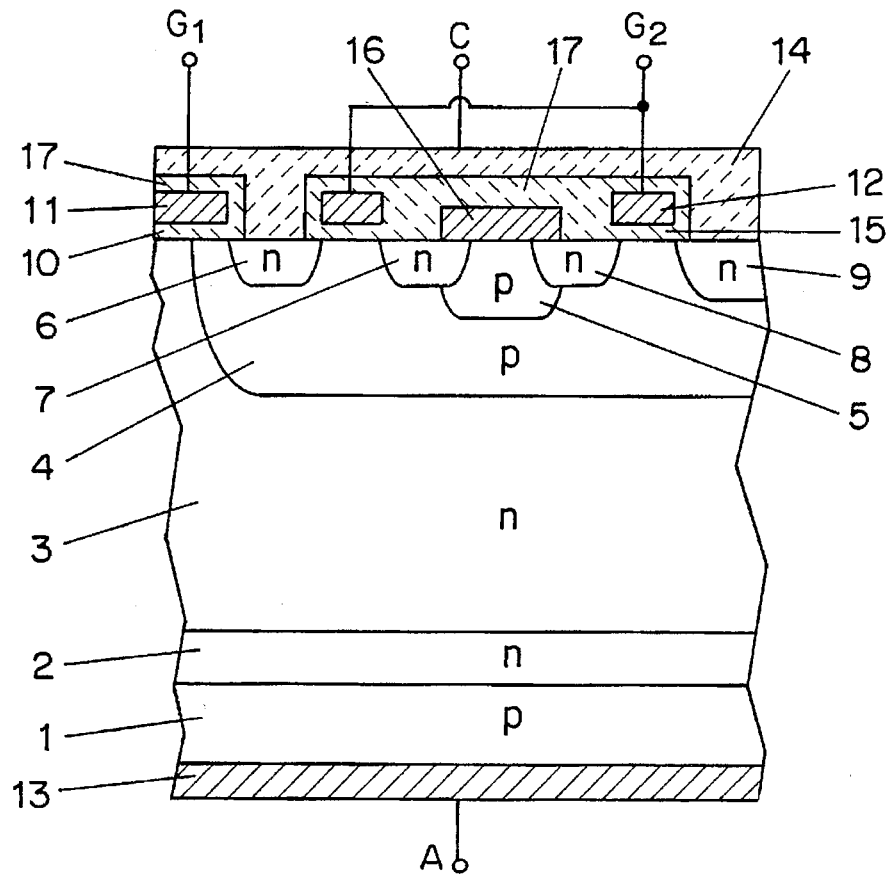
FIG. 1 is a sectional view showing the first embodiment of an insulated gate thyristor according to the present invention.

FIG. 1 is a sectional view showing a first embodiment of an insulated gate thyristor according to the present invention. FIG. 1 shows a half cell, i.e. a unit which includes two control or gate electrodes, the other half of the cell being a reflection of the image shown in FIG. 1. In the present insulated gate thyristor, many half cells may be repeatedly arranged two dimensionally, the pattern of two half cells repeating. A not shown voltage withstand structure may be arranged in the periphery of the device.

In FIG. 1, a (p) type base region 4 is formed in a surface layer on the first side of an (n) type base layer 3 with high resistivity, and a (p) type emitter layer 1 is formed on the second side of an (n) type buffer layer 2 laminated on the second side of the (n) type base layer 3. The first (n) type source region 6, the second (n) type source region 7 and the third (n) type source region 8, separated from each other, are formed in a surface layer of the (p) type base region 4. An (n) type emitter region 9 is diffused more deeply than the source regions 6, 7, and 8 in the surface layer of the (p) type base region 4. A (p) type contact region 5 is formed in the surface layer of the (p) type base region 4 between the second (n) type source region 7 and the third (n) type source region 8. An auxiliary electrode 16 bridged between the second (n) type source region 7 and the third (n) type source region 8 straddles the (p) type contact region 5. The first gate electrode 11 is deposited on the first gate oxide film 10 above the surface area of the (p) type base region 4 sandwiched between exposed surfaces of the first (n) type source region 6 and the (n) type base layer 3. The second gate electrodes 12 are deposited on the second gate oxide film 14 above surface areas of the (p) type base region 4 sandwiched between the first (n) type source region 6 and the second (n) type source region 7 and between the third (n) type source region 8 and the (n) type emitter region 9. Thus, a lateral n-channel MOSFET for switching between the thyristor and the IGBT modes is formed. An anode 13 as the first main electrode connected to an anode terminal A is deposited on a second surface of the (p) type emitter layer 1. A cathode 15 as the second main electrode connected to a cathode terminal C is deposited commonly on the first (n) type source region 6 and the (n) type emitter region 9. The first gate electrode 11, the second gate electrode 12, the auxiliary electrode 16 and the cathode 15 are isolated from each other by an insulation film 17 of phosphorus silicate glass (PSG), silicon oxide or the like.

Figure 2:
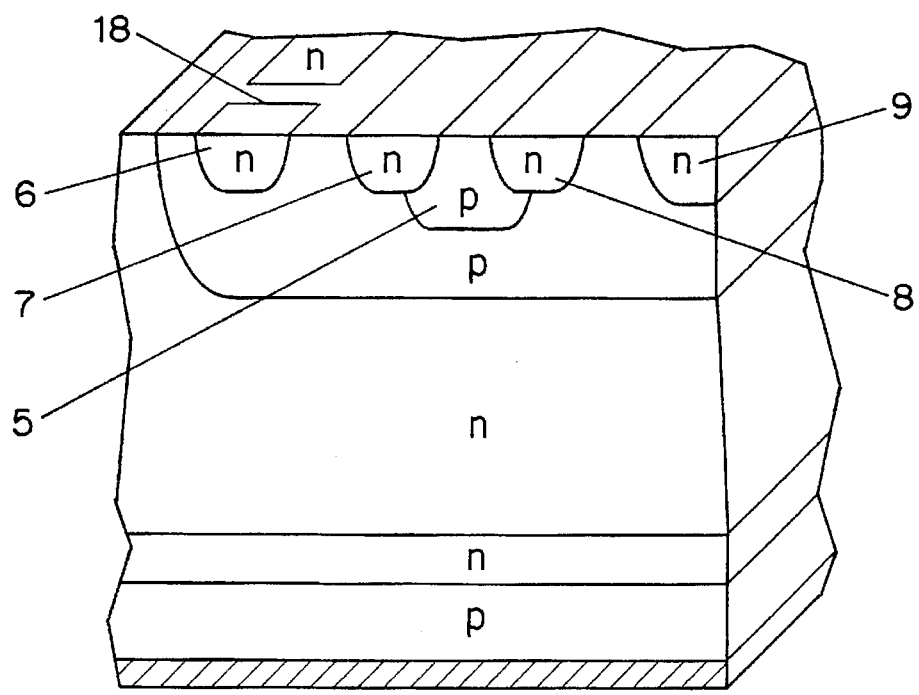
FIG. 2 is an isometric view of the insulated gate thyristor of FIG. 1.

FIG. 2 is an isometric view of the insulated gate thyristor of FIG. 1, from which the gate oxide films 10, 14, the insulation film 17 and the electrodes 11, 12, 15, 16 are removed. FIG. 2 shows the profile of the first (n) type source region 6. Though the first (n) type source region 6 extends in parallel with the other (n) type source regions 7 and 8, the first source region 6 is divided into a plurality of source stripes extending longitudinally leaving a part (interrupt region) 18 of the surface layer of the (p) type base region 4 in between. In the vertical columnar region in the top of which the first source region 6 exists, a quadruple layer structure is formed which comprises the (p) type emitter layer 1, the (n) type buffer layer 2 and the base layer 3, the (p) type base region 4 and the first (n) type source region 6. In the vertical columnar region which lacks the first source region 6, a pnp triple layer structure is formed.

By applying a positive voltage to the first gate electrode 11 in the state in which the cathode 15 is grounded and a positive voltage is applied to the anode 13, an inversion layer (partial storage layer) is formed in the surface layer of the (p) type base region 4 beneath the gate oxide film 10. The first (n) type source region 6 and the exposed surface area of the (n) type base region 3 are connected through the inversion layer. Then, electrons are supplied to the (n) type base region 3 through a route from the cathode 15 via the first (n) type source region 6 to the channel of the MOSFET. The electrons function as a base current of a pnp transistor comprising the (p) type emitter layer 1, the (n) type buffer layer 2 and the base layer 3, and the (p) type base region 4, and drive the pnp transistor. And, holes injected from the (p) type emitter layer 1 flow to the (n) type base layer 3 via the (n) type buffer layer 2. A part of the holes flows to the (p) type base region 4. The holes flow into the (p) type base region 4, boost the potential of the (p) type base region 4, and promote electron injection from the (n) type emitter region 9. Thus, the insulated gate thyristor is brought to its thyristor operation mode. At this point, the second gate electrode 12 is kept at zero potential.

In turning off the insulated gate thyristor, the lateral MOSFET is switched on, first by boosting the potential of the second gate electrode 12 above the threshold value of the MOSFET. Then, the (p) type base region 4 is biased at the equi-potential with the cathode 15 through the MOSFET. As a result, holes injected from the (p) type emitter layer 1 flow in the cathode 15 to shift the insulated gate thyristor to the IGBT operation mode after passing through the (p) type base region 4, the (p) type contact region 5, the auxiliary electrode 16, the second (n) type source region 7, the channel and the first (n) type source region 6 or through the (p) type base region 4, the (p) type contact region 5, the auxiliary electrode 16, the third (n) type source region 8, the channel and the (n) type emitter region 9. By lowering the potential of the first gate electrode 11 below the threshold value at this point, the insulated gate thyristor is turned off through the similar switching process with that of the IGBT. Since the current passes through the above described MOSFET in this operation mode, a bipolar transistor structure is left by disposing the interrupt region 18 which lacks a part of the first (n) type source region 6 as shown in FIG. 2. By this configuration, the controllable current is increased, since the switching current which passes through the channel with low carrier mobility is reduced at turn-off.

Figure 3:
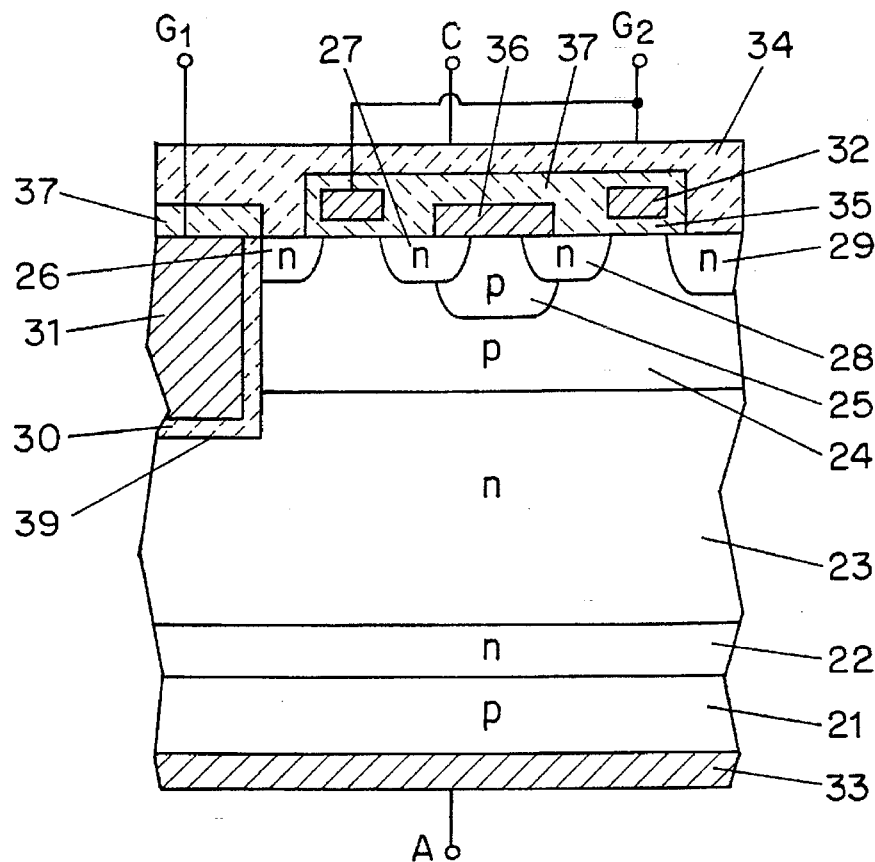
FIG. 3 is a sectional view showing the second embodiment of an insulated gate thyristor according to the present invention.

FIG. 3 is a sectional view showing a second embodiment of an insulated gate thyristor according to the present invention. In FIG. 3, a (p) type base layer 24 is formed on the first side of an (n) type base region 23 with high resistivity, and a (p) type emitter layer 21 is formed on an (n) type buffer layer 22 laminated on the second side of the (n) type base layer 23. The first (n) type source region 26, the second (n) type source region 27 and the third (n) type source region 28, spaced from each other, are formed in a surface layer of the (p) type base layer 24. An (n) type emitter region 29 is diffused more deeply than the source regions 26, 27, and 28. A (p) type contact region 25 is formed in the surface layer of the (p) type base layer 24 between the second (n) type source region 27 and the third (n) type source region 28. An auxiliary electrode 36 bridged between the second (n) type source region 27 and the third (n) type source region 28 straddles the (p) type contact region 25. Second gate electrodes 32 are deposited on the second gate oxide film 34 above surface areas of the (p) type base layer 24 sandwiched between the first (n) type source region 26 and the second (n) type source region 27, and between the third (n) type source region 28 and the (n) type emitter region 29. The configuration described so far is the same as that of FIG. 1. However, in the second embodiment, a trench 39 penetrates the (p) type base layer 24 from the surface of the first (n) type source region 26 down to the (n) type base layer 23, and the first gate electrode 31 is disposed on a gate oxide film 30 deposited on the inside faces of the trench 39.

Like the first embodiment, a lateral n-channel MOSFET for switching between the thyristor and the IGBT modes is formed. An anode 33 as the first main electrode connected to an anode terminal A is deposited on a back surface of the (p) type emitter layer 21. A cathode 35 as the second main electrode connected to a cathode terminal C is deposited commonly on the first (n) type source region 26 and the (n) type emitter region 29. The first gate electrode 31, the second gate electrode 32, the auxiliary electrode 36 and the cathode 35 are isolated from each other by an insulation film 37 of phosphorus silicate glass (PSG), silicon oxide or the like.

Figure 4:
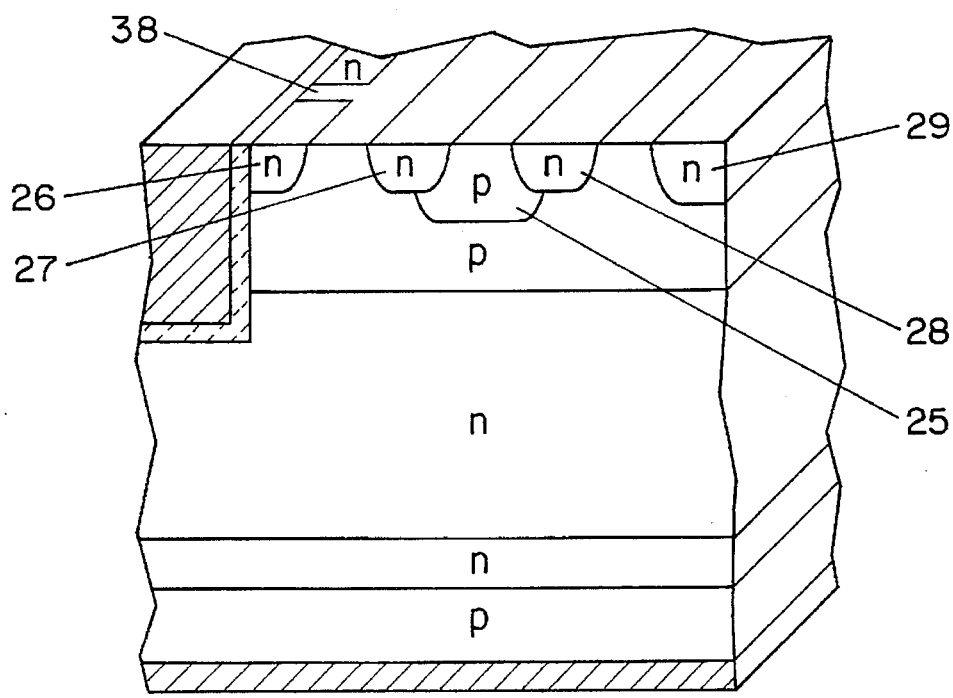
FIG. 4 is an isometric view of the insulated gate thyristor of FIG. 3.

FIG. 4 is an isometric view of the insulated gate thyristor of FIG. 3, from which the cathode 35, the second gate oxide films 34, the insulation film 37, the second gate electrode 32 and the auxiliary electrode 36 are removed. FIG. 4 shows the profile of the first (n) type source region 26. Though the first (n) type source region 26 extends longitudinally as the other (n) type source regions 27 and 28, the first source region 26 is divided by an interrupt region 38 into longitudinally aligned source stripes. In the columnar region in the top of which the first source region 26 is disposed, a pnpn quadruple layer structure is formed which consists of the (p) type emitter layer 21, the (n) type buffer layer 22 and the base layer 23, the (p) type base region 24, and the first (n) type source region 26. In the region in which the interrupt region 38 is disposed, a pnp triple layer structure is formed.

Though the insulated gate thyristor of FIG. 3 turns on and off in the same way as the insulated gate thyristor of FIG. 1, the insulated gate thyristor of FIG. 3 facilitates a dense configuration of the cell patterns. The trench structure of the first gate electrode 31 also allows for controlling a larger current per unit area.

Figure 5:
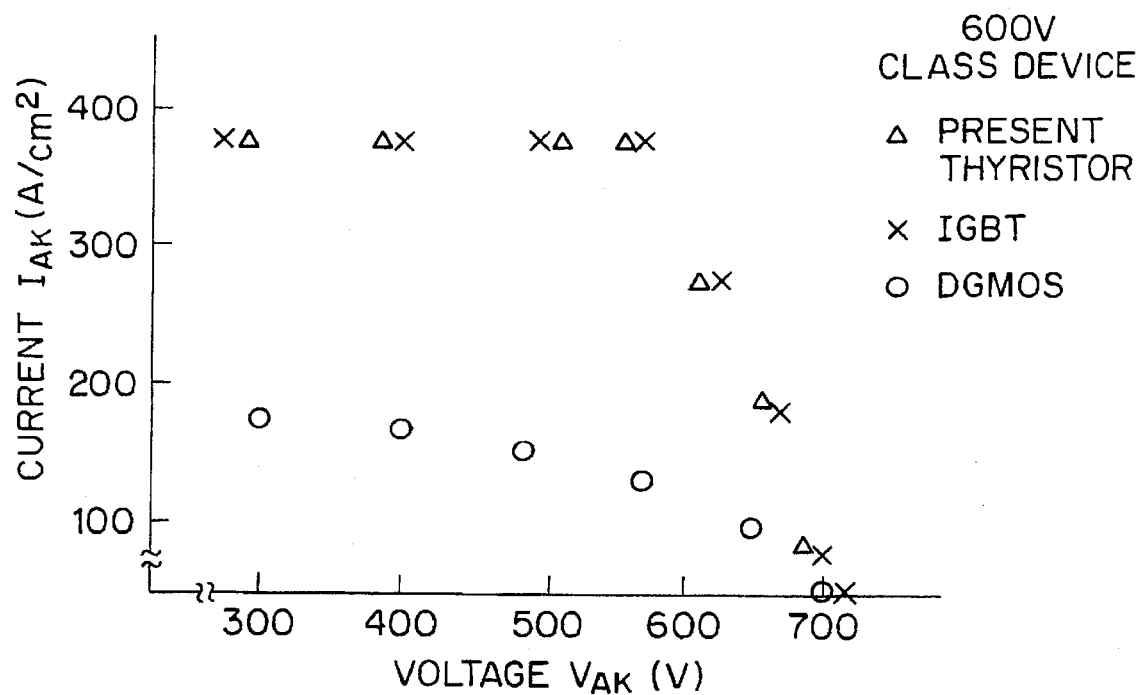
FIG. 5 is a voltage-current diagram which compares the reverse bias safe operation area (RBSOA) of the insulated gate thyristor of FIG. 3 with those of the DGMOS and the IGBT according to the prior art (600V class)
Figure 6:
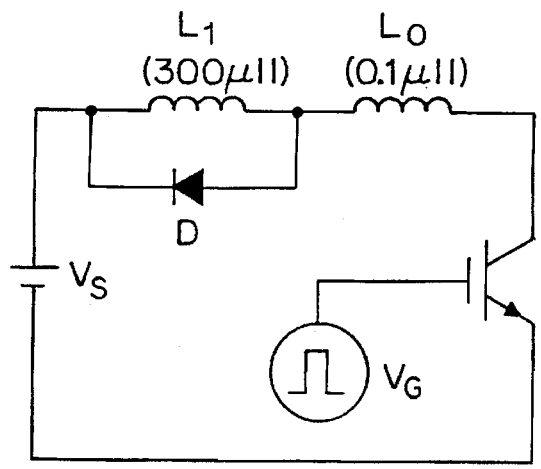
FIG. 6 is a diagram of a circuit for measuring a reverse bias safe operation area.
Figure 8:
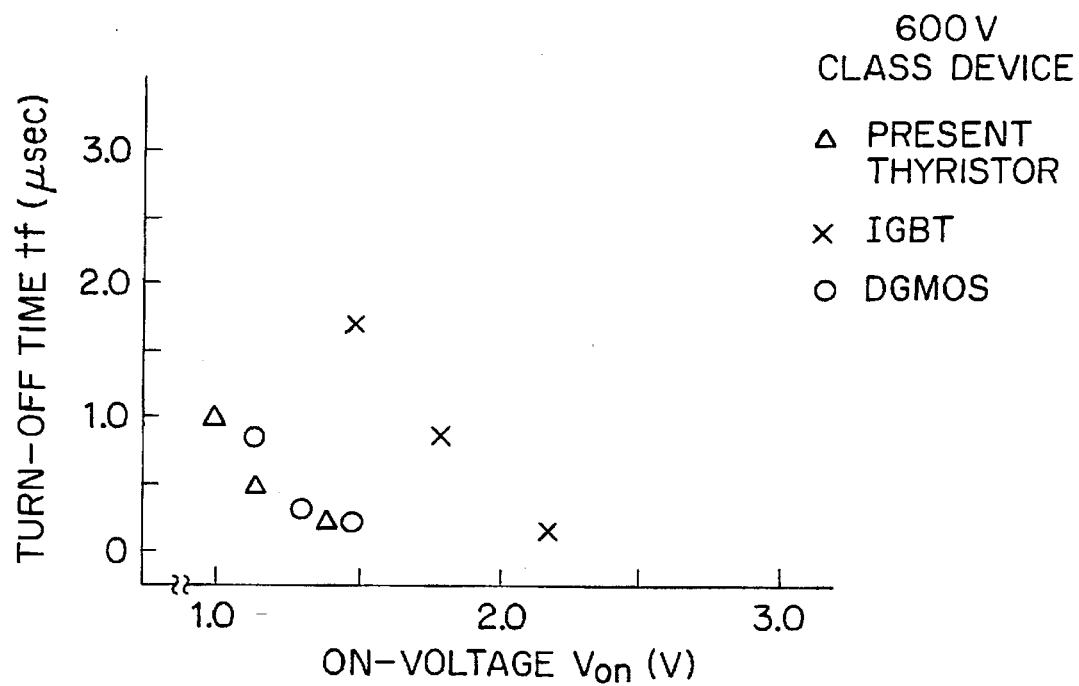
FIG. 8 is a graph which compares the trade-off characteristics between the on-voltage and the turn-off time of the 600V class devices.

FIG. 5 is a voltage-current diagram which compares the reverse bias safe operation area (RBSOA) of the insulated gate thyristor of FIG. 3 with those of the DGMOS and the IGBT according to the prior art. In FIG. 5, the abscissa represents the voltage between the anode and the cathode, and the ordinate the current density. FIG. 6 is a diagram of a circuit for measuring the reverse bias safe operation area of FIG. 5. These three devices were designed and manufactured as the 600V class devices. All the devices use an epitaxial wafer comprising a (p) type silicon substrate 0.02 Ωcm in resistivity and 450 μm in thickness as the (p) type emitter layer 21 or collector layer 41; an epitaxial layer of 0.1 Ωcm in resistivity and 10 μm in thickness as the (n) type buffer layer 22 or 42; and an epitaxial layer of 40 Ωcm in resistivity and 55 μm in thickness as the (n) type base layer 23 or 43. The epitaxial layers are grown on the silicon substrate. The chip size for these test devices is 1 cm$^2$. The on-voltage, defined by the potential drop when a current of 100A flows through the device, is 1.1V for the insulated gate thyristor of the present invention, 1.1V for the DGMOS, and 2.3V for the IGBT. As shown by FIGS. 8 and 5 respectively, the insulated gate thyristor of the present invention shows on-voltage lower than that of the IGBT, and breakdown withstand capability as high as that of the IGBT and twice as high as that of the DGMOS.

FIG. 8 is a graph which compares the trade-off characteristics between the on-voltage and the turn-off time of the three kinds of devices. The abscissa represents the on-voltage and the ordinates the turn-off time. FIG. 8 shows that the insulated gate thyristor according to the present invention has excellent trade-off characteristics compared to those of the IGBT and the DMOSFET. That is, the insulated gate thyristor according to the present invention realizes a low on-voltage and a short turn-off time in one single device.

Figure 7:
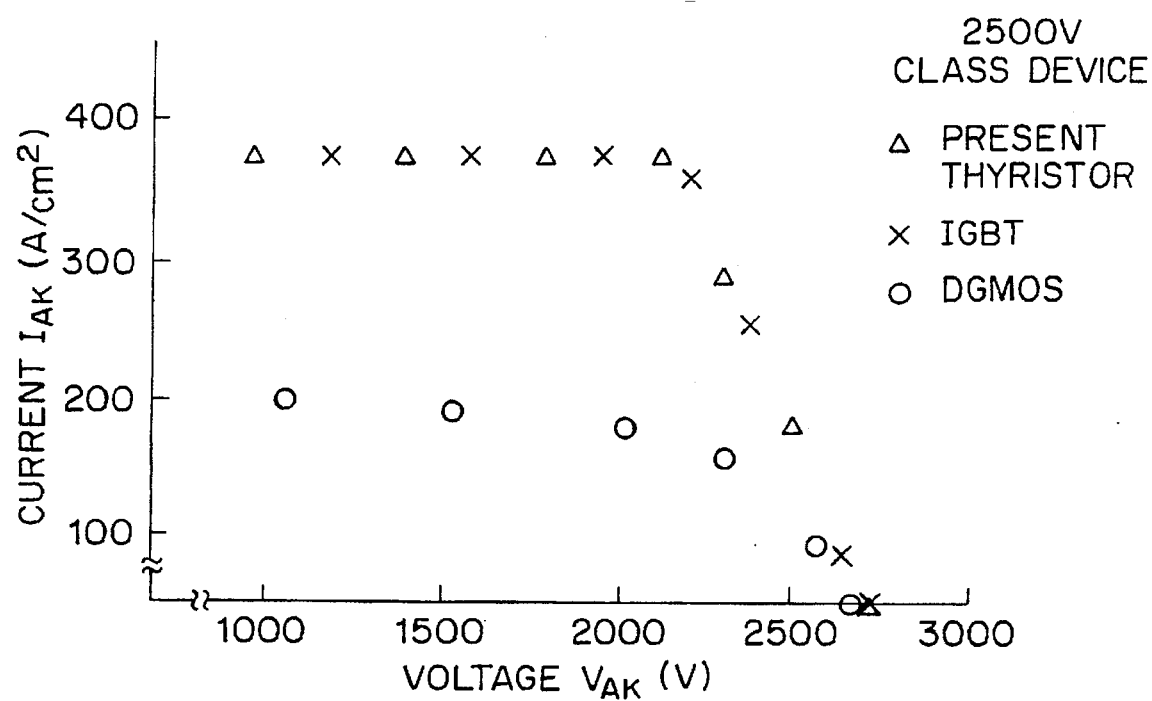
FIG. 7 is a voltage-current diagram which compares the reverse bias safe operation area of the insulated gate thyristor which lacks the (n) type buffer layer with those of the DGMOS and the IGBT according to the prior art (2500V class)

In FIGS. 1 and 3, the (n) type buffer layers 2, 22 are disposed between the (p) type emitter layers 1, 21 and the (n) type base layers 3, 23, respectively. The (n) type buffer layer is not necessary to the present invention, however. FIG. 7 is a voltage-current diagram comparing the reverse bias safe operation area of an insulated gate thyristor that lacks the (n) type buffer layer with prior art DGMOS and IGBT devices. In FIG. 7, the abscissa represents the voltage between the anode and the cathode, and the ordinate represents the current density. These three devices were designed and manufactured as 2500V class devices. All the devices use a bulk silicon wafer in place of an epitaxial wafer. The on-voltage is 1.3V for the insulated gate thyristor of the present invention, 1.3V for the DGMOS, and 3.8V for the IGBT. As shown by FIG. 7, the insulated gate thyristor of the present invention has much wider reverse bias safe operation area than is shown by the DGMOS and the IGBT. Thus, insulated gate thyristors of the present invention have widened reverse bias safe operation range irrespective of the method of substrate crystal growth, of the resistivity of the (n) type base region, and of the current amplification factor of the pnp wide base transistor, and without causing on-voltage rise.

Figure 9:
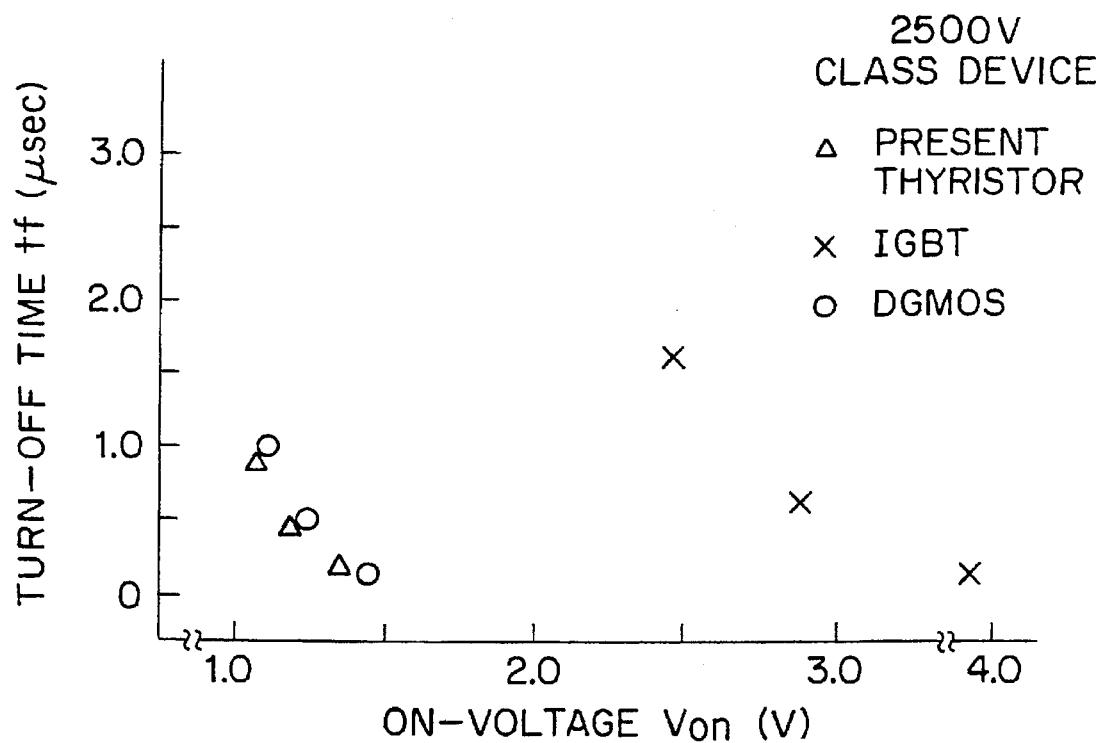
FIG. 9 is a graph which compares the trade-off characteristics between the on-voltage and the turn-off time of the 2500V class devices.
Figure 11:
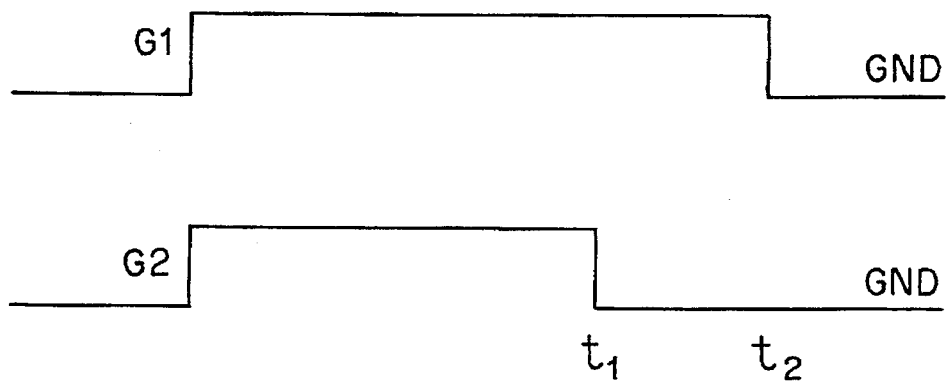
FIG. 11 is a wave chart showing the voltage for driving the insulated gate thyristor of FIG. 10.
Figure 10:
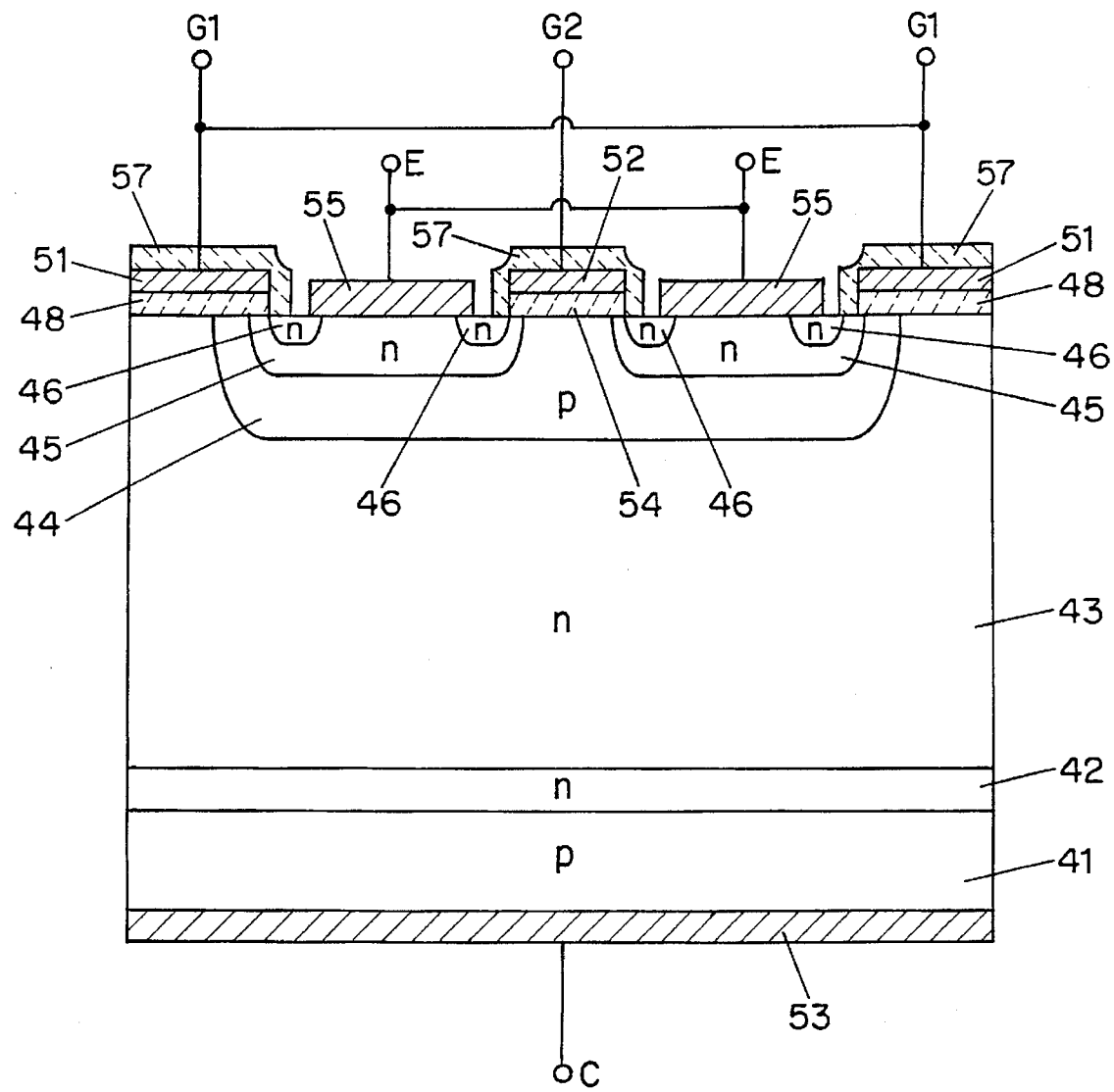
FIG. 10 is a sectional view showing an insulated gate thyristor according to the prior art.

FIG. 9 compares the trade-off characteristics between the on-voltage and the turn-off time of the three kinds of 2500V class devices. The abscissa represents the on-voltage and the ordinate represents the turn-off time. FIG. 9 shows that the insulated gate thyristor according to the present invention has excellent trade-off characteristics as compared to the IGBT and the DMOSFET. That is, the present invention realizes a low on-voltage and a short turn-off time in one single device.

Device functioning may be appreciated in the following terms: A channel is formed in the surface layer of the base region of the second conductivity type by the application of a voltage to the first gate electrode. The first carrier injected from the second main electrode (cathode) functions as a base current of the base layer of the bipolar transistor to operate the bipolar transistor. The base of the bipolar transistor consists of the buffer layer and the base layer (or the first base layer) sandwiched between the emitter layer and the base region (or the second base layer). In response, the second carrier is injected from the emitter layer. Since the injected second carrier encourages injection of the first carrier, a thyristor, comprising the emitter layer, the buffer layer and the base layer (or the first base layer), the base region (or the second base layer), and the emitter region, operates to make between the first main electrode (anode) and the second main electrode conductive at low on-voltage. When turning off the insulated gate thyristor, by applying a voltage to the second gate electrode to form channels between the emitter region and the third source region and between the second source region and the first source region, the second carrier injected from the emitter layer flows from the base layer to the emitter region via the auxiliary electrode, the second source region and the channel to shift the insulated gate thyristor to the IGBT mode of operation, and high speed turn-off of the insulated gate thyristor is facilitated. In the switching of the double gate insulated gate thyristor of the prior art, since all the current flows through the channel formed by the voltage application to the second gate electrode, the controllable current is limited by the resistance of the low mobility channel. Therefore, the breakdown withstand capability of the insulated gate thyristor of the prior art is small. In contrast, the insulated gate thyristor according to the present invention reduces the current which flows through the above-described channel and increases the controllable current by flowing the switching current not only through the MOSFET but also through the bipolar transistor comprising the emitter layer, the buffer layer and base layer (or the first base layer), and the base region (or the second base layer), and then through the interrupt region.

Since the unit cell size is reduced and the area ratio of the built-in thyristor to the total area is increased by adopting a trench structure for the first gate electrode, the on-resistance of the insulated gate thyristor is lowered. The withstand voltage of the insulated gate thyristor is increased by making the buffer layer more heavily doped than the base layer between the base layer and the emitter layer. And thyristor operation at turn-on of the insulated gate thyristor is stabilized by diffusing the emitter region more deeply than the first, second and third source regions.

By disposing the interrupt region between the source stripes of the first source region, smooth shift to the bipolar transistor operation mode at turn-on of the insulated gate thyristor is facilitated.

By applying a voltage to the first gate electrode at turn-on of the insulated gate thyristor, low on-voltage at the thyristor mode is realized. The insulated gate thyristor is turned off by shifting first to the IGBT mode by applying a voltage to the second gate electrode, and then, by removing the voltage applied to the first gate electrode.

Insulated gate thyristors of the present invention have improved breakdown withstand capability, as a part of the main current from the bipolar transistor flows directly to the main electrodes without flowing through the MOSFET when switching from the thyristor operation mode to the IGBT operation mode by using two gates. The present invention facilitates obtaining voltage driven type insulated gate thyristors with greatly improved breakdown withstand capability and trade-off characteristics between the on-voltage and the turn-off time than those of the devices of the prior art in the withstand voltage range from 600V to 2500V.

I claim:

1. An insulated gate thyristor comprising:
   a base layer of a first conductivity type and of high resistivity, having a first side and a second side;
   a base region of a second conductivity type selectively formed in a surface layer on the first side of the base layer;
   first, second and third source regions of the first conductivity type formed in a surface layer of the base region, said first source region comprising a plurality of source stripes aligned longitudinally and spaced from each other;
   an emitter region of the first conductivity type formed in the surface layer of the base region;
   a contact region of the second conductivity type formed in the surface layer of the base region in contact with the second source region and the third source region;
   a first gate electrode formed on an insulation film above a surface area of the base region between the first source region and an exposed area of the base layer;
   a second gate electrode formed on an insulation film above a surface area of the base region between the first source region and the second source region and above a surface area of the base region between the third source region and the emitter region;
   an auxiliary electrode contacting in common with the second source region, the third source region and the contact region;
   an emitter layer of the second conductivity type formed on a second side of the base layer;
   an anode disposed on a surface of the emitter layer; and
   a cathode contacting in common with the first source region, the emitter region and the base region.

2. The insulated gate thyristor of claim 1, further comprising a buffer layer of the first conductivity type formed between the first base layer and the emitter layer, the buffer layer being more heavily doped than the first base layer.

3. The insulated gate thyristor of claim 1, wherein the emitter region is diffused more deeply than the first, second and third source regions.

4. An insulated gate thyristor comprising:
   a first base layer of a first conductivity type and of high resistivity, having a first side and a second side;
   a second base layer of a second conductivity type formed on the first side of the base layer;
   first, second and third source regions of the first conductivity type formed in a surface layer of the second base layer, said first source region comprising a plurality of source stripes aligned longitudinally and spaced from each other;
   a trench dug from a surface of the second base layer including the first source region down to the first base layer through the second base layer;
   an emitter region of the first conductivity type formed in the surface layer of the second base layer;
   a contact region of the second conductivity type formed in the surface layer of the second base layer in contact with the second source region and the third source region;
   a first gate electrode formed on an insulation film deposited on inside faces of the trench;
   a second gate electrode formed on an insulation film above a surface area of the second base layer between the first source region and the second source region and above a surface area of the second base layer between the third source region and the emitter region;
   an auxiliary electrode contacting in common with the second source region, the third source region and the contact region;
   an emitter layer of the second conductivity type formed on a second side of the first base layer;
   an anode disposed on a surface of the emitter layer; and
   a cathode contacting in common with the first source region, the emitter region and the second base layer.

5. The insulated gate thyristor of claim 4, further comprising a buffer layer of the first conductivity type formed between the first base layer and the emitter layer, the buffer layer being more heavily doped than the first base layer.

6. The insulated gate thyristor of claim 4, wherein the emitter region is diffused more deeply than each of the first, second and third source regions.

* * * * *